United States Patent
Qi et al.

(10) Patent No.: US 10,797,640 B2
(45) Date of Patent: Oct. 6, 2020

(54) SYSTEM AND METHOD FOR AUTOMATED PERFORMANCE ASSESSMENT OF PEROVSKITE OPTOELECTRONIC DEVICES

(71) Applicant: OKINAWA INSTITUTE OF SCIENCE AND TECHNOLOGY SCHOOL CORPORATION, Kunigami-gun, Okinawa (JP)

(72) Inventors: Yabing Qi, Kunigami-gun (JP); Luis Katsuya Ono, Kunigami-gun (JP); Mikas Remeika, Kunigami-gun (JP); Sonia Ruiz Raga, Kunigami-gun (JP)

(73) Assignee: OKINAWA INSTITUTE OF SCIENCE AND TECHNOLOGY SCHOOL CORPORATION, Kunigami-gun, Okinawa (JP)

(*) Notice: Subject to any disclaimer, the term of this patent is extended or adjusted under 35 U.S.C. 154(b) by 23 days.

(21) Appl. No.: 16/306,713

(22) PCT Filed: May 29, 2017

(86) PCT No.: PCT/JP2017/019872
§ 371 (c)(1),
(2) Date: Dec. 3, 2018

(87) PCT Pub. No.: WO2017/212968
PCT Pub. Date: Dec. 14, 2017

(65) Prior Publication Data
US 2019/0131926 A1    May 2, 2019

Related U.S. Application Data

(60) Provisional application No. 62/345,809, filed on Jun. 5, 2016.

(51) Int. Cl.
*G01R 31/26*    (2020.01)
*H02S 50/15*    (2014.01)
(Continued)

(52) U.S. Cl.
CPC .......... *H02S 50/15* (2014.12); *G01R 31/2601* (2013.01); *H01L 51/0031* (2013.01); *H02S 50/10* (2014.12); *Y02E 10/549* (2013.01)

(58) Field of Classification Search
CPC ................ G01R 31/26; G01R 31/2601; G01R 31/2605; G01R 31/2607; G01R 31/2635; G01R 31/50; G01R 27/08; G01R 15/146
See application file for complete search history.

(56) References Cited

U.S. PATENT DOCUMENTS

| | | | |
|---|---|---|---|
| 9,176,182 B2* | 11/2015 | Hishikawa | ............... H02S 50/15 |
| 2005/0179460 A1* | 8/2005 | Mizukami | .......... G01N 21/9501 |
| | | | 324/754.23 |

(Continued)

FOREIGN PATENT DOCUMENTS

| | | |
|---|---|---|
| CN | 104218890 A | 12/2014 |
| WO | 2011/066554 A2 | 6/2011 |
| WO | 2015/184197 A2 | 12/2015 |

OTHER PUBLICATIONS

Ono et al., "Pinhole-free hole transport layers significantly improve the stability of MAPbI$_3$-based perovskite solar cells under operating conditions", Journal of Materials Chemistry A, 2015, 3, pp. 15451-15456 and Supporting Information, cited in Specification (22 pages).

(Continued)

*Primary Examiner* — Thang X Le
(74) *Attorney, Agent, or Firm* — Westerman, Hattori, Daniels & Adrian, LLP

(57) ABSTRACT

A system and method for assessing performance of a plurality of perovskite optoelectronic devices are disclosed. The system comprises a chamber, a light source, a switch board for allowing selection of a device among a plurality of devices in the chamber for measurement; a DC voltage supply for applying voltage to the device, a source/measure unit (SMU) for measuring current of the device; and a (Continued)

computer implemented with a software program including computer executable instructions to control at least the SMU, the DC voltage supply, the switch board, and the light source. The computer-implemented method for the performance assessment by using the system includes obtaining at least one of first current-versus-voltage (I-V) data according to a first procedure and second I-V data according to a second procedure for analyzing hysteresis behavior of the device.

20 Claims, 16 Drawing Sheets

(51) Int. Cl.
*H02S 50/10* (2014.01)
*H01L 51/00* (2006.01)

(56) References Cited

U.S. PATENT DOCUMENTS

| | | | |
|---|---|---|---|
| 2006/0238750 A1* | 10/2006 | Shimotomai | G01J 1/08 356/213 |
| 2011/0320145 A1* | 12/2011 | Horng | G01R 27/08 702/65 |
| 2013/0106371 A1 | 5/2013 | Shimura | |
| 2013/0181736 A1 | 7/2013 | Gostein et al. | |
| 2013/0214808 A1* | 8/2013 | Wang | G01N 21/55 324/750.24 |
| 2014/0354323 A1 | 12/2014 | Hishikawa et al. | |
| 2015/0106045 A1 | 4/2015 | Shimura et al. | |
| 2015/0127276 A1* | 5/2015 | Monokroussos | H02S 50/15 702/58 |
| 2015/0188487 A1* | 7/2015 | Yoshidomi | H02S 50/10 324/761.01 |
| 2015/0287852 A1 | 10/2015 | Leung et al. | |

OTHER PUBLICATIONS

Ono et al., "Temperature-dependent hysteresis effects in perovskite-based solar cells", Journal of Materials Chemistry A, 2015, 3, pp. 9074-9080, cited in Specification (7 pages).
International Search Report dated Aug. 22, 2017, issued in counterpart application No. PCT/JP2017/019872 (3 pages).
Written Opinion dated Aug. 22, 2017, issued in counterpart application No. PCT/JP2017/019872 (4 pages).
Office Action dated Aug. 14, 2019, issued in counterpart CN Application No. 201780034646.3, with English translation. (16 pages).
Extended (supplementary) European Search Report dated Apr. 17, 2019, issued in counterpart EP Application No. 17810147.3. (7 pages).
Office Action dated Apr. 14, 2020, issued in counterpart CN Application No. 201780034646.3, with English translation. (8 pages).

* cited by examiner

SYSTEM AND METHOD FOR AUTOMATED PERFORMANCE ASSESSMENT OF PEROVSKITE OPTOELECTRONIC DEVICES

TECHNICAL FIELD

The present invention relates to a system and method for automated performance assessment of perovskite optoelectronic devices by taking into consideration the hysteresis effects prominent in these devices.

BACKGROUND ART

A solar cell (also called a photovoltaic cell) is an electrical device that converts solar energy into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, $CH_3NH_3PbX_3$ and $CH_3NH_3SnX_3$, where X=Cl, Br, I or a combination thereof, for example, have recently emerged as a promising material for the next generation of high efficiency, low cost solar technology. It has been reported that these synthetic perovskites can exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, chemical vapor deposition (CVD), etc.

Recent reports have indicated that this class of materials, i.e., organometal halide perovskites, have potential for high-performance semiconducting media in other optoelectronic devices as well. In particular, some perovskites are known to exhibit strong photoluminescence properties, making them attractive candidates for use in light-emitting diodes (LEDs). Additionally, it has been reported that perovskites also exhibit coherent light emission properties, hence optical amplification properties, suitable for use in electrically driven lasers. In these devices, electron and hole carriers are injected into the photoluminescence media, whereas carrier extraction is needed in solar cell devices.

It has been reported that solar cells based on organometal halide perovskite exhibit hysteresis behavior including strong dependence of the photocurrent on the voltage scan directions. Hysteresis in these cells is influenced mainly by the perovskite grain size and the structure of the underlying electron transport layer. The hysteresis effects are generally associated with a high capacitance in a perovskite solar cell compared to Si or other types of solar cells. Such hysteresis effects prominent in perovskite solar cells give rise to concerns revolving around the accuracy of reported efficiency values in the past, thereby to the need for better practices than conventional ones for measuring and reporting perovskite solar cell performances. That is, it is important to find a set of consistent and reliable measurement rules for characterizing perovskite solar cells. Some commercial measurement systems provide preconditioning that can be used to investigate the effects of mobile ions, ferroelectricity or deep trap sites, which are considered to be physical causes for the hysteresis behavior of perovskites. However, these are merely additional steps to the typical solar cell evaluation and assessment, and often are not accurate enough.

In view of the above problems associated with hysteresis behavior and other prominent characteristics pertaining to perovskite-based optoelectronic devices, this document describes an automated comprehensive system including controlling software for measuring and assessing perovskite device performances based on a high-throughput method with a set of consistent and reliable specifications.

CITATION LIST

Non Patent Literature

NPL1: L. K. Ono et al., Pinhole-free hole transport layers significantly improve the stability of $MAPbI_3$-based perovskite solar cells under operating conditions, J. Mater. Chem. A 3, 15451-15456 and Supporting Information (2015).

NPL2: L. K. Ono et al., Temperature-dependent hysteresis effects in perovskite-based solar cells, J. Mater. Chem. A 3, 9074-9080 (2015).

SUMMARY OF INVENTION

A system and method for assessing performance of a plurality of perovskite optoelectronic devices are disclosed. The system comprises: a chamber housing a device holder configured to hold a plurality of devices, the chamber having a chamber wall defining an opening that is sealed with a window; a light source configured to emit light that enters the chamber through the window to shine the plurality of devices in the device holder, wherein the plurality of devices are a plurality of perovskite solar cells; a switch board coupled to the device holder for allowing selection of a device among the plurality of devices for measurement; a DC voltage supply coupled to the switch board to apply voltage to the device; a source/measure unit (SMU) coupled to the switch board for measuring current of the device; and a computer implemented with a software program including computer executable instructions to control at least the SMU, the DC voltage supply, the switch board, and the light source. The computer-implemented method for the performance assessment by using the present system comprises: selecting, by the switch board, a device among the plurality of devices for measurement; applying, by the DC voltage supply, voltage to the device, the voltage being in a form of a staircase function of time, wherein a stepwise increase in voltage is given for a forward scan and a stepwise decrease in voltage is given for a reverse scan; measuring, by the SMU, current of the device, wherein current values during an acquisition time are measured after each stepwise increase in voltage for the forward scan and after each stepwise decrease in voltage for the reverse scan; and obtaining, based on the measured current values, at least one of first current-versus-voltage (I-V) data according to a first procedure and second I-V data according to a second procedure for analyzing hysteresis behavior of the device. The first procedure includes averaging of the measured current values over the acquisition time for each voltage value. The second procedure includes transient signal modeling to obtain a steady-state current value for each voltage value. The measurement can be repeated with a predetermined interval to obtain the time evolution of performance parameters based on at least one of the first I-V data for the forward scan and the reverse scan that are repeatedly obtained and the second I-V data for the forward scan and the reverse scan that are repeatedly obtained.

DESCRIPTION OF EMBODIMENTS

Source materials for fabricating an organometal halide perovskite film include halide metals such as $PbCl_2$, $PbBr_2$, $PbI_2$, $SnCl_2$, $SnBr_2$, $SnI_2$ and the like, and methylammonium ($MA=CH_3NH_3^+$) compounds such as $CH_3NH_3Cl$, $CH_3NH_3Br$, $CH_3NH_3I$, and the like. In place of, or in a combination with the MA compound, a formamidinium ($FA=HC(NH_2)_2^+$) compound can also be used. Organometal halide perovskites are generally expressed as $ABX_3$, in which an organic element, MA, FA or other suitable organic element, occupies each site A; a metal element, $Pb^{2+}$ or $Sn^{2+}$, occupies each site B; and a halogen element, $Cl^-$, $I^-$ or $Br^-$, occupies each site X. Source materials are denoted as AX and $BX_2$, where AX represents an organic halide compound having an organic element MA, FA or other suitable organic element for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, as long as each is selected from the halogen group. For example, X in the AX can be Cl, while X in the $BX_2$ can be Cl, I or Br. Accordingly, formation of a mixed perovskite, e.g., $MAPbI_{3-x}Cl_x$, is possible. The terms "perovskite" and "organometal halide perovskite" are used interchangeably and synonymously in this document.

Organometal halide perovskite can be used for an active layer in an optoelectronic device, such as a solar cell, LED, laser, etc. Here, the "active layer" refers to an absorption layer where the conversion of photons to charge carriers (electrons and holes) occurs in a photovoltaic device; for a photo-luminescent (i.e., light-emitting) device, it refers to a layer where charge carriers are combined to generate photons.

Developments of automated comprehensive systems including controlling software programs are considered for measuring and assessing perovskite-based device performances. The present system and software programs are configured specifically to take into consideration the hysteresis effects prominent in perovskite-based optoelectronic devices, by using a high-throughput method. Details of the system and the controlling software to perform the computer-implemented method according to the present embodiments are explained below with reference to accompanying drawings.

Figure 1:
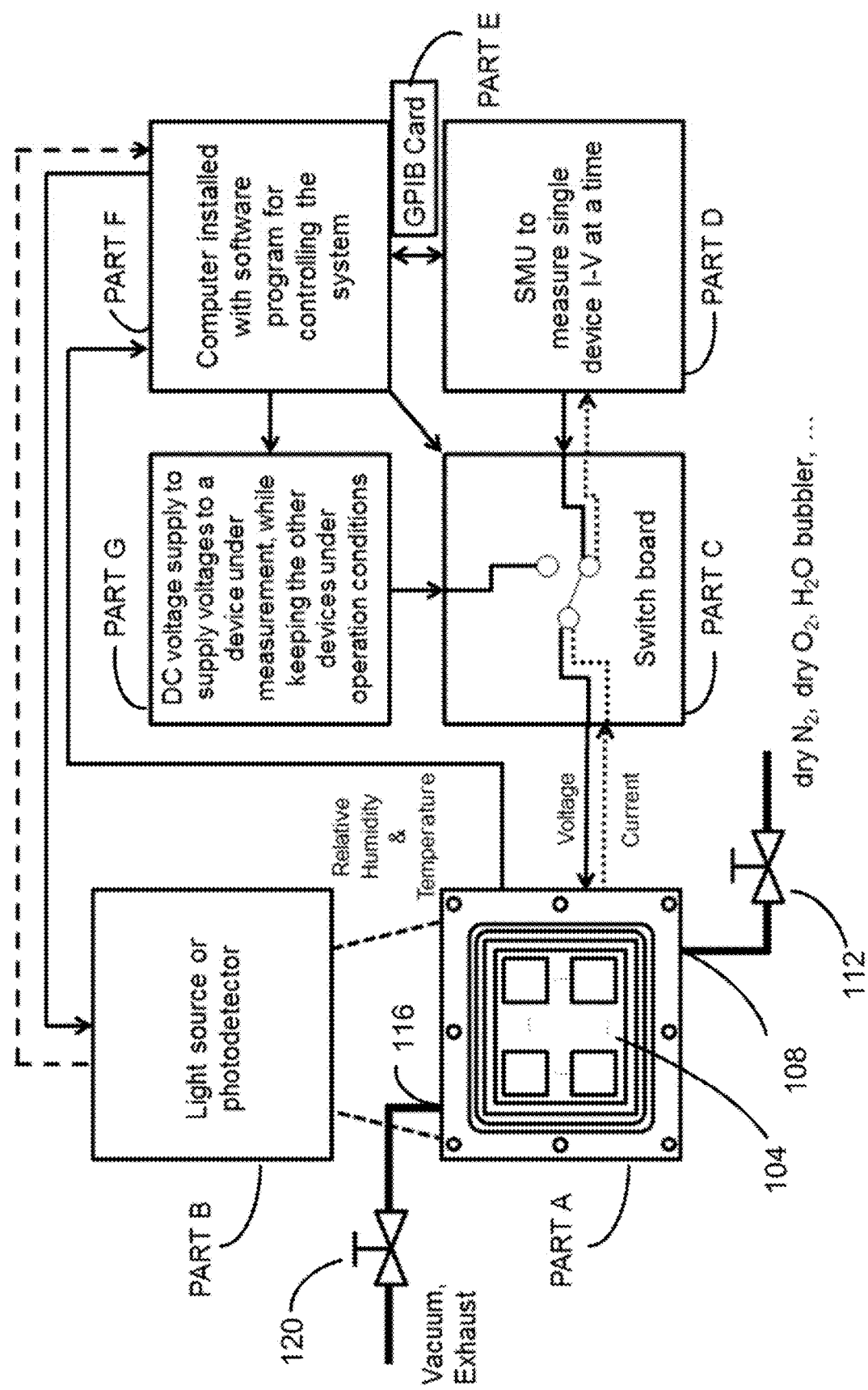
FIG. 1 is a block diagram illustrating the present system for performance assessment of perovskite optoelectronic devices.

FIG. 1 is a block diagram illustrating the present system for performance assessment of perovskite optoelectronic devices. PART A represents a chamber for test devices to be placed. A device holder 104 is housed in the chamber for holding multiple devices. The device holder 104 may be configured to have two or more sockets for multiple devices to be inserted, and each socket may be configured to hold one or more devices. The number of sockets, as well as the number of devices each socket can hold, can be varied. Thus, the number of devices (N) to be tested can also be varied. The chamber has a gas inlet 108 coupled to an external gas source, which is controlled to provide dry $N_2$, dry $O_2$, and other types of gasses with humidity, temperature, pressure and other parameters in a controlled manner. A duct with an adjustable valve 112 is illustrated as an example for controlling the gas flow entering the chamber; however, any other controlling means can be utilized as conceived by one with ordinary skill in the art. The chamber also has a gas outlet 116 coupled to a vacuum pump through a duct with an adjustable valve 120, in this example, to control the vacuuming and exhausting. A humidity sensor, a temperature sensor, or a combination thereof may be housed in the chamber to monitor the environment surrounding the test devices placed in the device holder 104 in the chamber (PART A). These sensors can be configured to communicate with a computer; that is, a software program installed in the computer can be configured to acquire data measured or monitored by the one or more sensors. The top opening of the chamber can be covered and sealed with a lid serving as a window, which is made of a gas impermeable material, such as quartz, for light to enter or exit. It should be understood that the humidity and temperature sensors and the lid are omitted in FIG. 1 to avoid obscuring aspects of the depicted embodiments.

PART B is placed above PART A in the example configuration in FIG. 1, and represents a light source such as a solar simulator when the devices are solar cells, or a photodetector when the devices are LEDs, lasers, or other optoelectronic devices that emit light. When solar cells are chosen to be the devices for measurement, the solar simulator is configured to shine the devices in the chamber through the window attached at the top of the chamber. When LEDs, lasers and other light-emitting devices are chosen to be measured, the photodetector is configured to measure the emitted photons from the devices in the chamber through the window configured at the top of the chamber. As mentioned earlier, the top opening of the chamber can be covered and sealed with a lid serving as a window, which is made of a gas impermeable material, such as quartz, for light to enter or exit. In the following, details for the case of testing solar cells are described; the similar configurations and procedures can be applied for the case of testing light-emitting devices by changing the direction of light, or inverting the mechanism of converting photons to electron-hole carries to converting electron-holes pairs to photons.

PART C represents a switch board coupled to the device holder in the chamber for selecting a specific device among the N devices. As detailed below, the switch board is interfaced with a software program to enable measurements of multiple devices in a sequential way. The switch board may be configured to include expandable relay-based switch boards suitable for scalability.

PART D represents a source/measure unit (SMU) coupled to the switch board. A SMU is an instrument for voltage sourcing and/or current sourcing with a certain resolution. A SMU can be optimized for sweeping current and voltage to determine the current-versus-voltage (I-V) characteristics of a device. SMUs have been widely adopted, especially in the semiconductor industry, and are typically used in automated test systems. PART E represents a general-purpose interface bus (GPIB). PART F represents a computer installed with a software program, which can be written on a commercially available system design platform, such as the LabVIEW™ platform. The switch board (PART C) can be controlled by the software program installed in the computer (PART F), to sequentially select a device for each measurement. The SMU (PART D) is also coupled to the computer (PART F) through the GPIB (PART E) that allows communication between the SMU and the computer. The SMU, coupled with the switch board, is controlled to measure the current to obtain the I-V curves of one device at a time. When the devices under measurement are solar cells, the light source such as a solar simulator in PART B is controlled by the software program in the computer, as indicated by the solid line in FIG. 1. When the devices are LEDs, lasers and other light-emitting device, the photodetector in PART B is controlled by the software program in the computer to capture the emitted photons, and the data is acquired by the computer, as indicated by the dashed line in FIG. 1.

PART G represents a DC voltage supply, which is coupled to the switch board (PART C), to apply voltage to a device under measurement, while applying bias voltage to the other devices to be kept under operating conditions. The software program installed in the computer (PART F) includes instructions to control at least the switch board, the SMU, the DC voltage supply, and the light source or the photodetector. The software program can be further configured to acquire information on the internal environment of the chamber, measured/monitored by one or more sensors including a humidity sensor, a temperature sensor or a combination thereof housed in the chamber (PART A).

Figure 2:
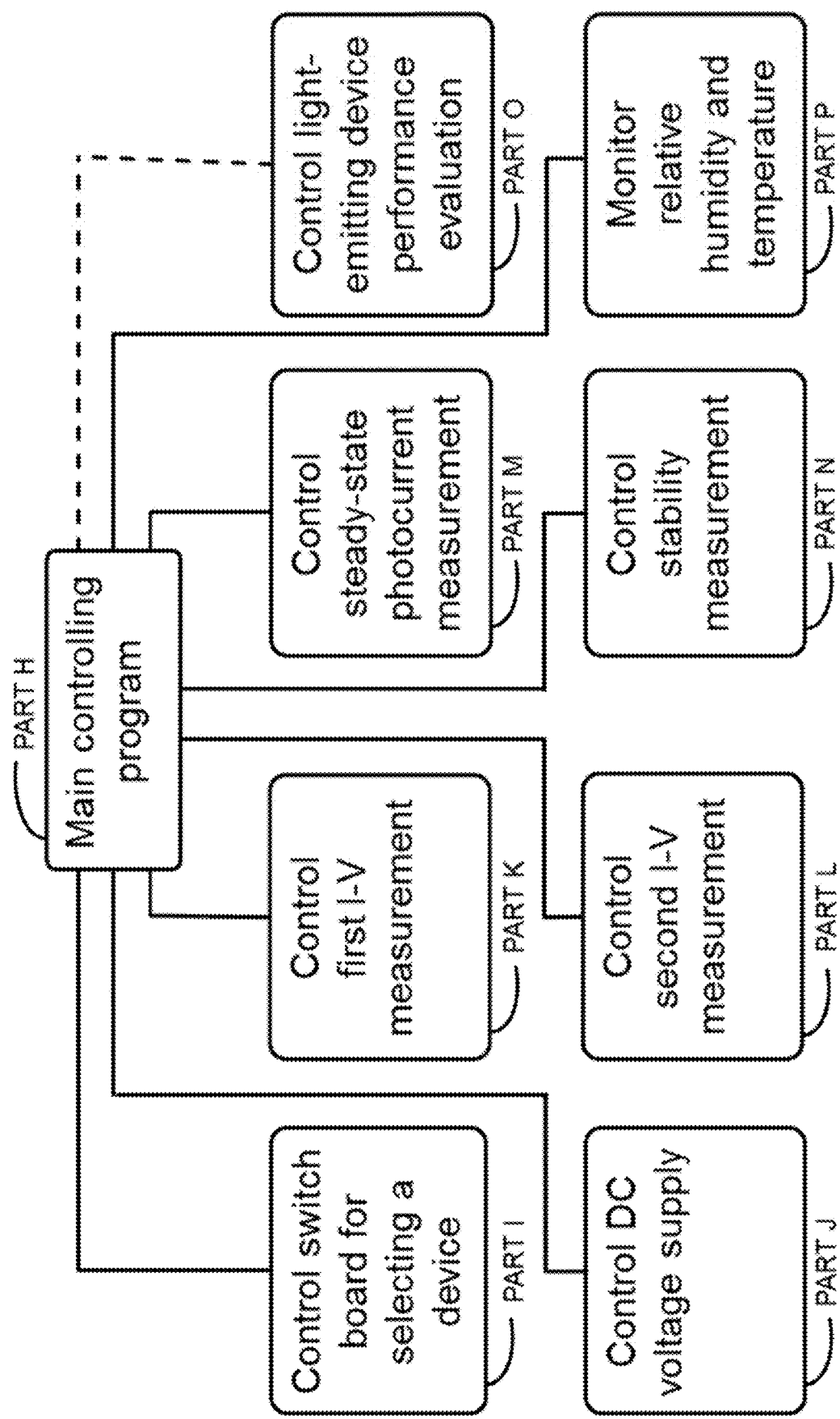
FIG. 2 is a block diagram illustrating the architecture of the software program installed with the computer.

FIG. 2 is a block diagram illustrating the architecture of the software program implemented with the computer. The software program may be stored in a memory of the computer, a CD or other medium associated with the computer and includes computer executable instructions that when executed by a processor perform the computer-implemented method including various steps and tasks as explained below. The software program comprises a main controlling program and multiple sub-programs. PART H is a main program for controlling sub-programs and including necessary algorithms. PART I is a sub-program that controls the switch board to select a specific device among N devices in the device holder 104. The selection can be made sequentially through the N devices. PART J is a sub-program that controls the DC voltage supply to apply voltage to a device under the measurement by the SMU, while applying bias voltage to the other devices to keep them under operating conditions. PART K is a sub-program that controls the SMU to measure current of the selected device to obtain first I-V data based on a first procedure (first I-V measurement). PART L is a sub-program that controls the SMU to measure current of the selected device to obtain second I-V data based on a second procedure (second I-V measurement). Details of the first and second procedures will be explained later in this document. PART M is a sub-program that controls the SMU to perform steady-state photocurrent measurement for the device selected by the controlled switch board. "Photocurrent" herein refers to the electric current through a device, occurring as a result of the photovoltaic effect. Hereinafter, the terms "current," "photocurrent" and "photocurrent density" are used synonymously and interchangeably in this document, since the conversion is trivial and obvious for one with ordinary skill in the art. PART N is a sub-program that controls at least the SMU and the DC voltage supply to perform a stability measurement for the device selected by the controlled switch board. When the system is used for performance evaluation of LEDs, lasers and other light-emitting devices, PART O is a sub-program that controls acquisition of data from the photodetector (PART B). PART P is a sub-program that controls acquisition of data of the environment in the chamber, such as relative humidity and temperature, which are monitored by one or more sensors housed in the chamber.

Figure 3B:
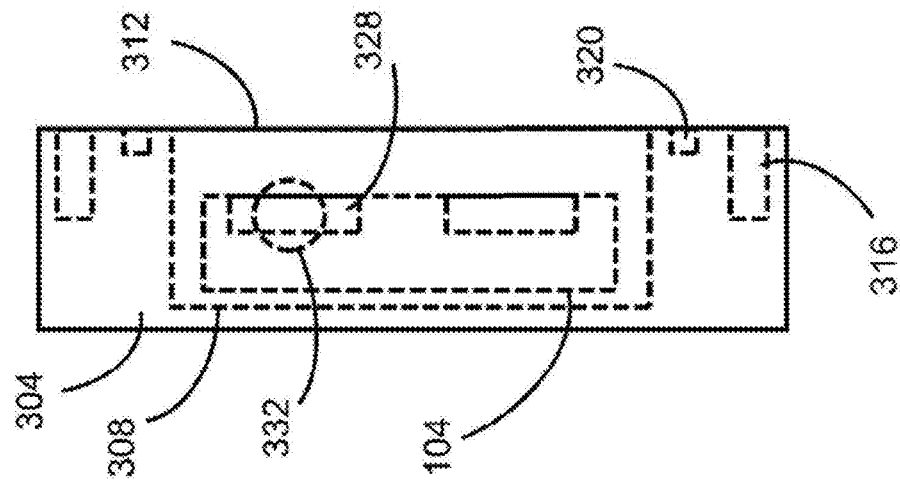
FIGS. 3A and 3B illustrate a top view and a side view of the chamber (PART A), depicting details of the mechanical structure.
Figure 3A:
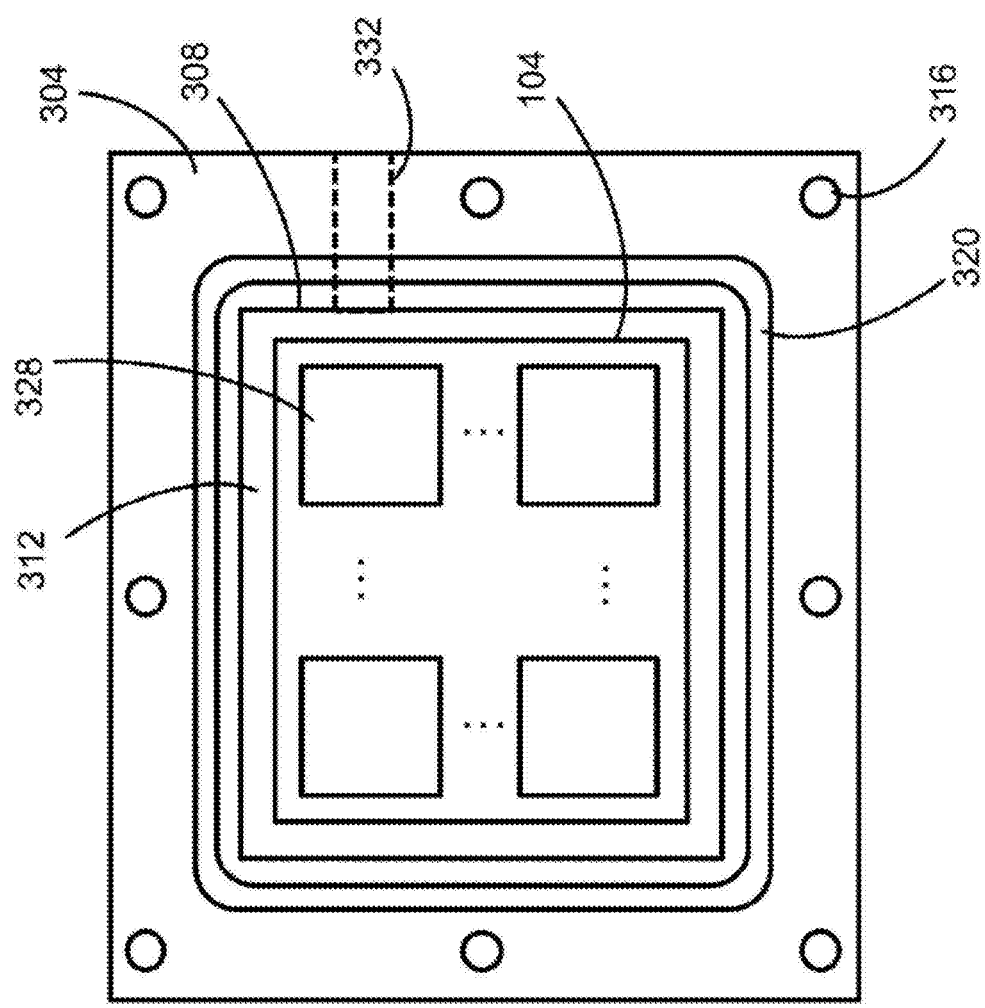

FIGS. 3A and 3B illustrate a top view and a side view of the chamber (PART A), depicting details of the mechanical structure. The chamber has a chamber wall 304 defining the inner surface 308 of the chamber wall 304 and an opening 312 at the top. In the example of FIGS. 3A and 3B, the chamber wall 304 comprises a bottom square section and four rectangle sections vertically attached to the four edges, respectively, defining the open top section 312. The chamber wall 304 has multiple holes 316 that are formed in the chamber wall 304 for screws or other fastening means to be inserted for securing a lid over the top opening 312. The lid can be made of a gas impermeable material such as quartz, providing a window for light to enter or exit. A groove 320 is formed around the opening for an O-ring to be accommodated for enforcing the sealing of the lid over the opening 312. The device holder 104 is housed in the chamber and enclosed by the inner surface 308 of the chamber wall 304, for holding two or more devices. In the example of FIGS. 3A and 3B, the device holder 104 includes a plurality of sockets 328, each socket 328 being configured to hold one or more devices. The device holder 104 is connected to electrical wires that run through a hole 332 made in the chamber wall 308.

Figures 4A, 4B:
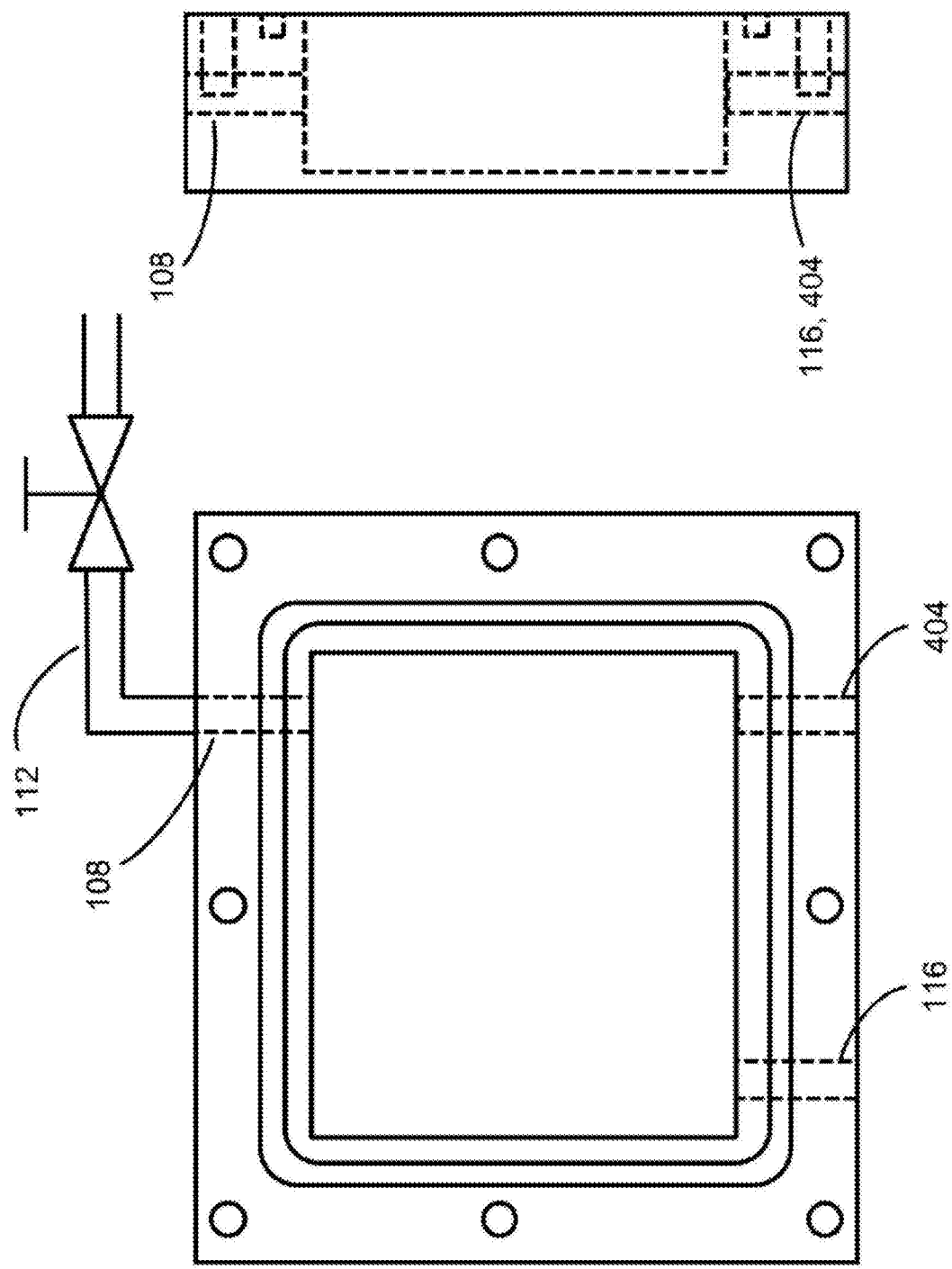
FIGS. 4A and 4B illustrate a top view and a side view of the chamber, depicting details of gas connections.

FIGS. 4A and 4B illustrate a top view and a side view of the chamber, depicting details of gas connections. The chamber has the gas inlet 108 coupled to an external gas source, which is controlled to provide dry $N_2$, dry $O_2$, and other types of gas with humidity, temperature, pressure and other parameters in a controlled manner. The duct with an adjustable valve 112 is illustrated as an example for controlling the gas flow entering the chamber; however, any other controlling means can be utilized as perceived by one of ordinary skill in the art. The hole in the chamber wall for the duct of the gas inlet 108 is indicated by dashed line in this figure. The chamber also has the gas outlet 116 coupled to an exhaust system or a vacuum pump through a duct for vacuuming and exhausting controls. The hole in the chamber wall for the duct of the gas outlet 116 is indicated by dashed line in this figure. The humidity and temperature sensors can be placed inside the chamber, and coupled with the computer via connections through a hole 404 indicated by dashed line in this figure.

Figure 5:
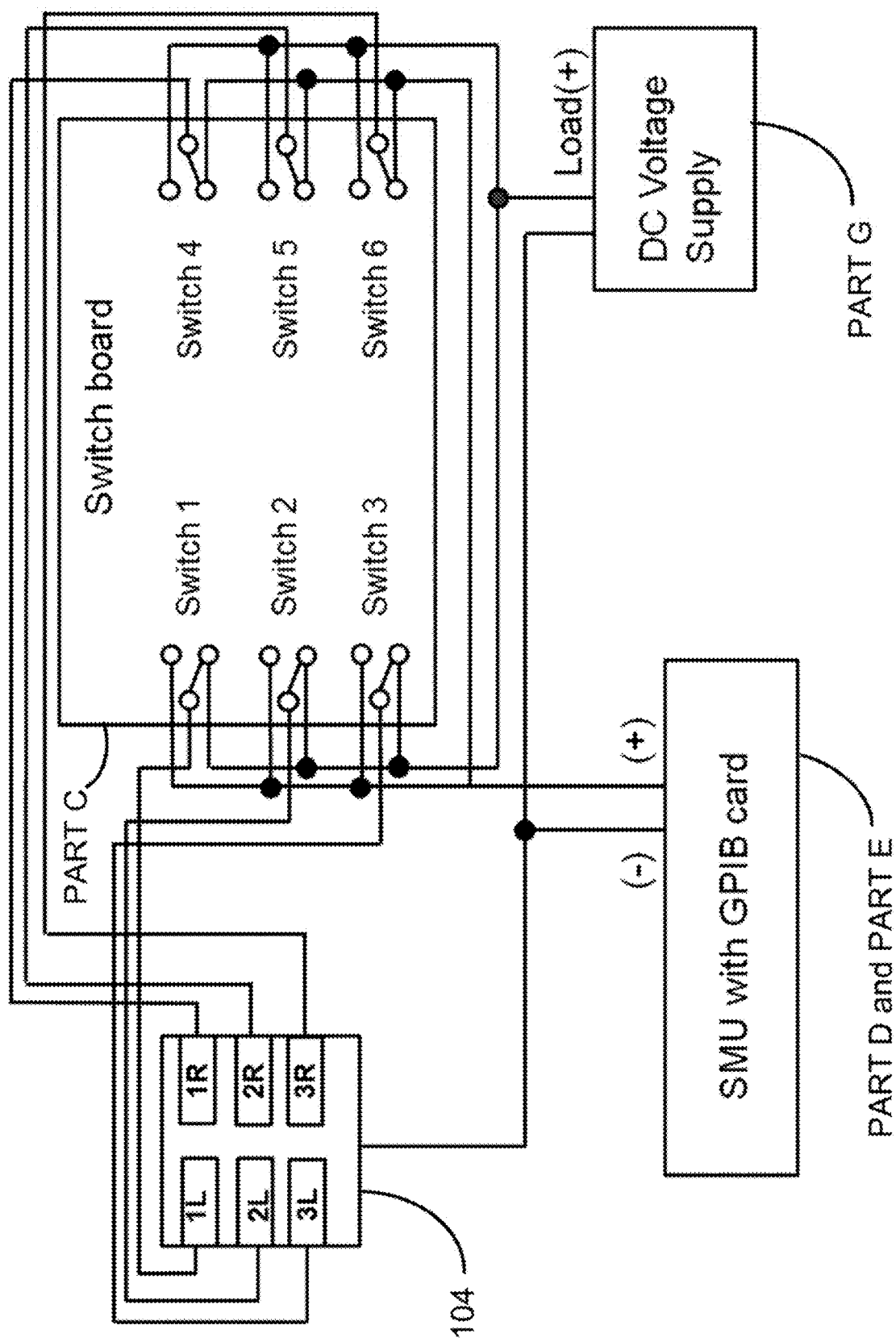
FIG. 5 is a block diagram illustrating connections for the devices in the device holder in the chamber (PART A), switches in the switching board (PART C), the SMU with the GPIB card (PART D and PART E), and the DC voltage supply (PART G).

FIG. 5 is a block diagram illustrating connections for the devices in the device holder 104 in the chamber (PART A), switches in the switching board (PART C), the SMU with the GPIB card (PART D and PART E), and the DC voltage supply (PART G). These parts are all coupled to the computer (PART F) that includes a software program to control each function. Six device, labelled 1R, 2R, 3R, 1L, 2L and 3L, are placed in the device holder 104 in this example. Correspondingly, six switches, labelled Switches 1-6, are used in the switch board (PART C) to select one device for the I-V measurement by using the SMU (PART D). In this example, each switch is illustrated to be a single pole double throw switch; however, any other switch configuration, e.g., a multiple pole multiple throw configuration, can be used provided that one device is selected at a time for testing. When the switch is turned on for the device, the DC voltage supply (PART G) applies a voltage to the selected device, and the corresponding current is measured by the SMU (PART D). This process is repeated at each voltage step and by sweeping the entire voltage range to obtain the I-V curve for the selected device. The data is acquired and stored in the memory of the computer (PART F).

Figure 6:
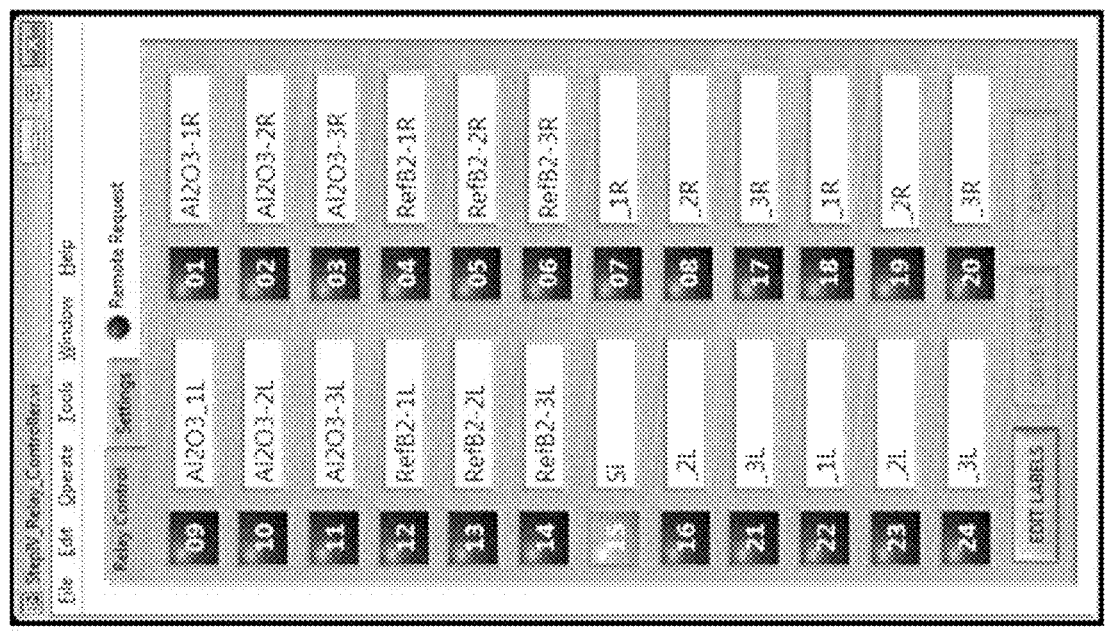
FIG. 6 is a photo showing an example of user interface to acquire user inputs for the sub-program PART I to control the switch board.

FIG. 6 is a photo showing an example of user interface to acquire user inputs for the sub-program PART I to control the switch board. In this example, a control panel is used for the user to enter parameters, e.g., a device number, name or ID to select a specific device by manually selecting by a mouse click. Additionally, the sub-program PART I for controlling the switch board can be configured to select a device automatically and in sequence among the N device in the chamber for consecutive measurements. The user may enter the desired order via the user interface, or a predetermined order may be stored in a memory of the computer and retrieved for the measurements.

Figure 7:
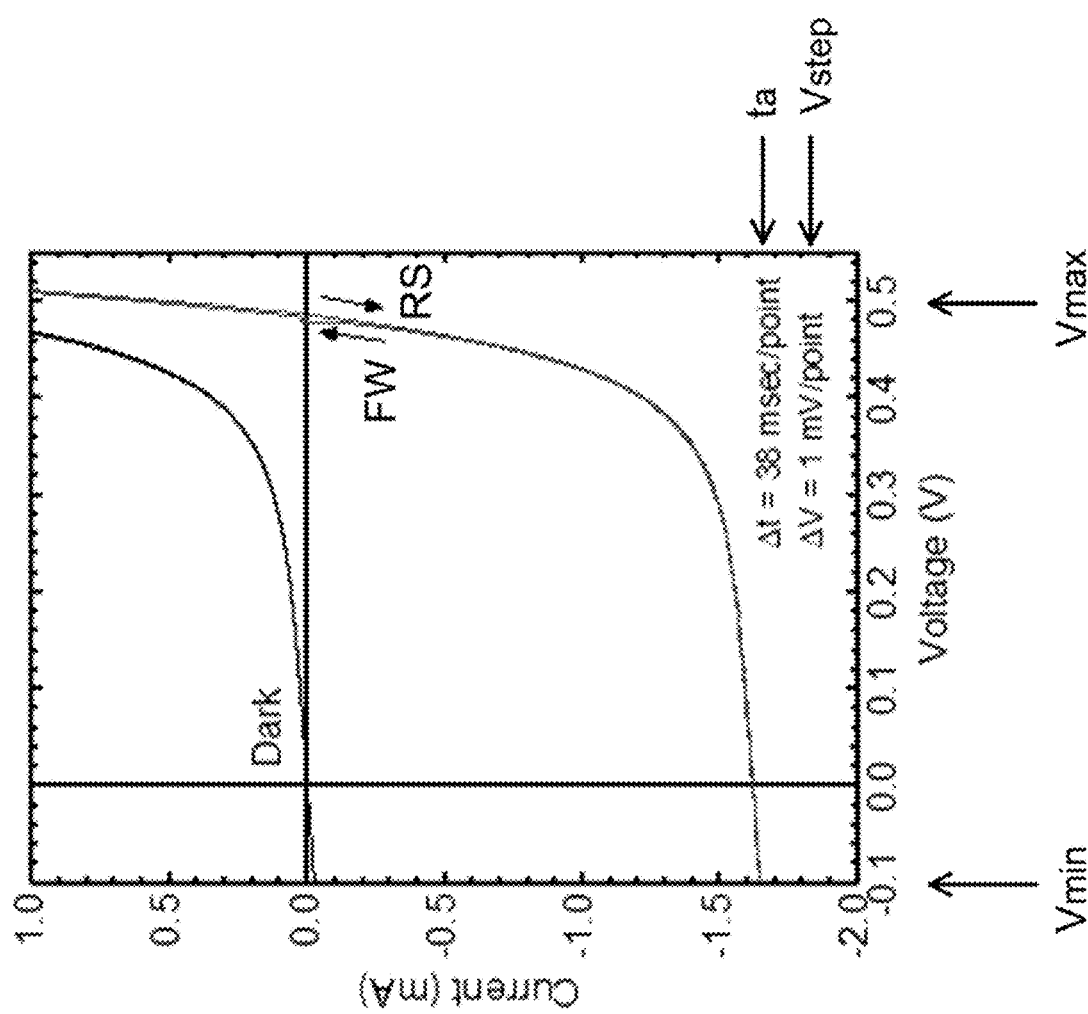
FIG. 7 shows plots of examples of the I-V data to aid the illustration of the sub-program PART K configured to carry out the first I-V measurement based on the first procedure for evaluating solar cell performances.

FIG. 7 shows plots of examples of the I-V data to aid the illustration of the sub-program PART K configured to carry out the first I-V measurement based on the first procedure for evaluating solar cell performances. The first procedure may be a conventional method including a typical procedure used for performance evaluation of perovskite solar cells. Parameters entered to execute the sub-program PART K for carrying out the first I-V measurement include: voltage control parameters, such as the minimum voltage maximum voltage $V_{min}$, voltage increment $V_{step}$, acquisition time $t_a$ during which the current is continuously measured and averaged. Scan direction can also be specified, i.e., from $V_{min}$ to $V_{max}$ (i.e., forward scan FW) or from $V_{max}$ to $V_{min}$ (i.e., reverse scan RS). Photocurrent density can be measured and converted to the current I. Parameters to control the light source are also entered, such as the illumination strength (e.g., 1 sun), light pre-soaking time and other light control parameters. The plot in FIG. 7 shows an example case of $V_{min}$=−0.1 V, $V_{max}$=0.5 V, $V_{step}$=1 mV, $t_a$=38 ms, and two arrows indicating the directions of the forward (FW) and reverse (RS) scans. Note that the current is continuously measured during the acquisition time $t_a$ after each voltage increase/decrease $V_{step}$, and the measured current values are averaged over $t_a$ to obtain the current value I at the voltage value V. Thus, the acquisition time $t_a$ can be relatively short, e.g., on the order of 1-10 ms, in the first procedure.

Figure 8:
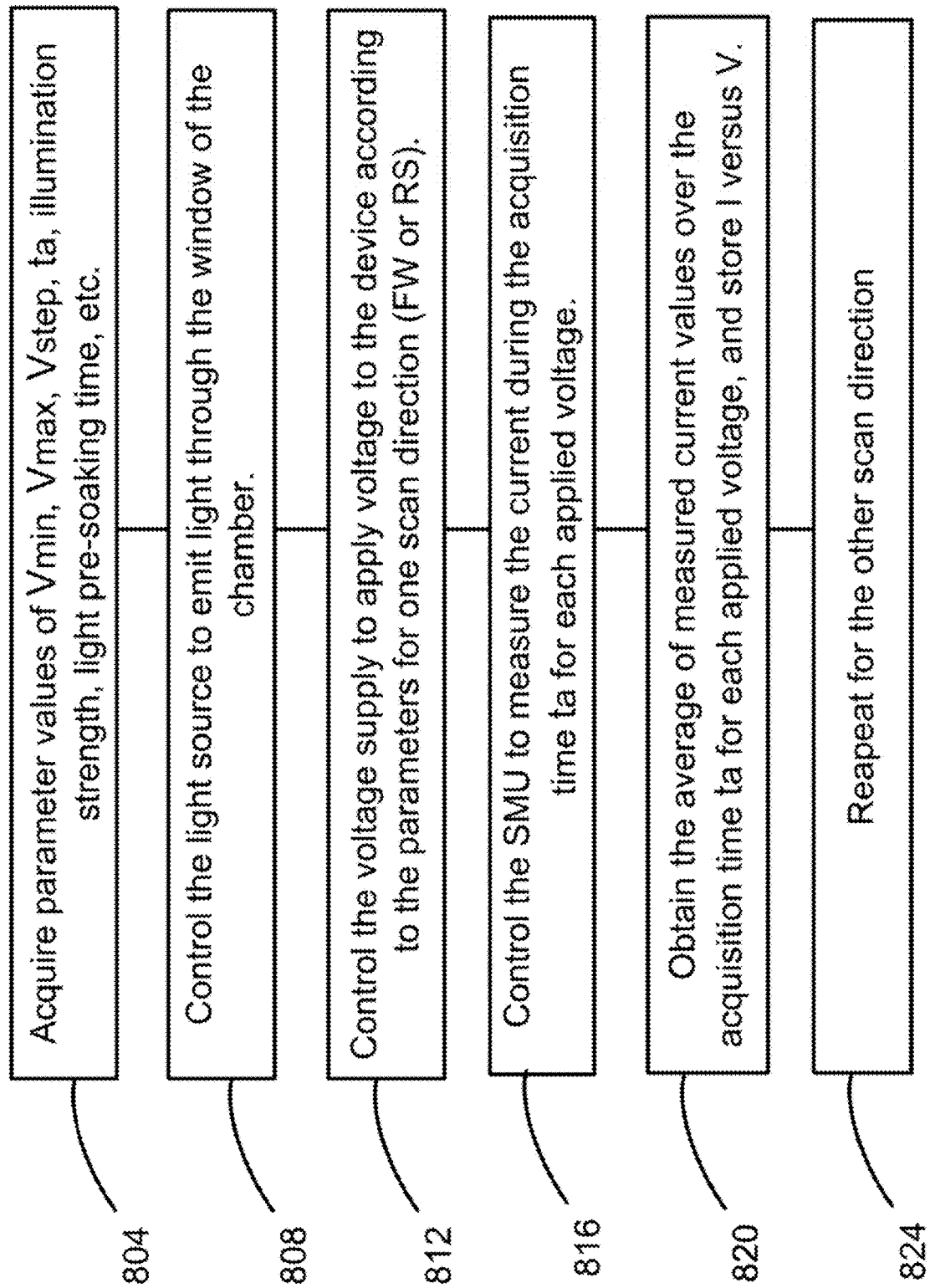
FIG. 8 shows an example process according to the sub-programs PART K and PART J for carrying out the first I-V measurement based on the first procedure.

FIG. 8 shows an example process according to the sub-programs PART K and PART J for carrying out the first I-V measurement based on the first procedure. Prior to starting the first I-V measurement according to the sub-programs PART K and PART J, the switch board is controlled by the sub-program PART I to select a device among the N devices in the device holder in the chamber, as per the user input using a user interface such as the control panel illustrated in FIG. 6, or to select devices in sequence automatically or as specified. In step 804, parameter values necessary for the first I-V measurements are acquired. These parameters include the voltage control parameters such as $V_{min}$, $V_{max}$, $V_{step}$, and $t_a$, etc. and the light control parameters such as illumination strength and pre-soaking time. These parameters may be inputted by the user using the control panel, or may be predetermined and pre-stored in a memory and retrieved in this step 804. In step 808, the light source is controlled to emit light through the window of the chamber to shine the device under measurement to provide energy, i.e., photons, according to the light control parameter values. In step 812, the voltage supply is controlled to apply voltage to the device according to the sub-program PART J with the voltage control parameters. That is, the voltage is varied with a stepwise increase/decrease $V_{step}$ after each $t_a$, giving the form of a staircase function of time. A stepwise increase $V_{step}$ is given for the FW scan, and a stepwise decrease $V_{step}$ is given for the RS scan. In step 816, the SMU is controlled to measure the current during the acquisition time $t_a$ for each applied voltage, wherein the voltage value starts with $V_{min}$ and increases by $V_{step}$ until $V_{min}$ is reached for the FW scan; or the voltage value starts with $V_{max}$ and decreases by $V_{step}$ until $V_{min}$ is reached for the RS scan. In step 820, the average of the measured current values over the acquisition time $t_a$ for each applied voltage is obtained. The resultant I versus V data may be stored in a memory. The same measurement is repeated for the other scan direction as in step 824. An example of the resultant I-V curve is plotted in FIG. 7, also showing the key parameter values. It should be understood by one with ordinary skill in the art that, in an engineering flow chart for actual programming, the steps for the measurement and computation for each applied voltage should be expressed in a do-loop by varying the voltage incrementally, and that the process flow expressed in FIG. 8 is for the purpose of illustrating the first procedure according to the embodiment.

Figure 9:
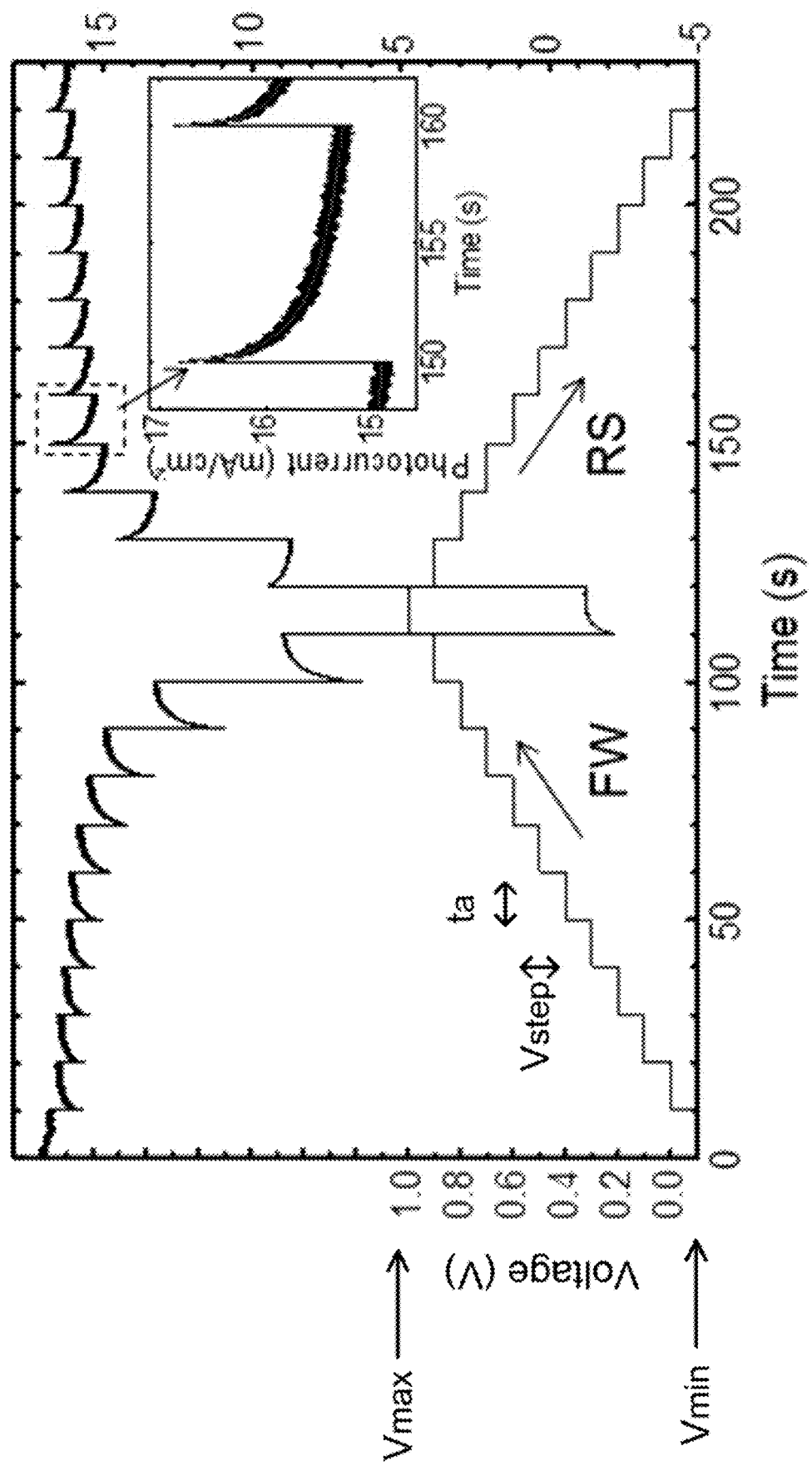
FIG. 9 shows plots of an example of the applied voltage versus time and the corresponding photocurrent versus time to aid the illustration of the sub-program PART L configured to carry out the second I-V measurement based on the second procedure for evaluating solar cell performances.

FIG. 9 shows plots of an example of the applied voltage versus time and the corresponding photocurrent versus time to aid the illustration of the sub-program PART L configured to carry out the second I-V measurement based on the second procedure for evaluating solar cell performances. The inset shows an expanded view of the part of the plot of the photocurrent versus time enclosed in dashed line in FIG. 9. The transient behavior of the photocurrent is clearly seen in the inset. It is also noted that the transient behavior shows different time dependence between the FW scan and the RS scan, exhibiting the hysteresis behavior prominent in perovskite-based optoelectronic device. In the present system and software programs, the second I-V measurement based on the second procedure is directed to analysing the hysteresis behavior for performance evaluation of perovskite-based optoelectronic devices. Voltage in the form of a staircase function is applied to the device, as shown in FIG. 9. Parameters entered for the second I-V measurement include: voltage control parameters, such as minimum voltage $V_{min}$, maximum voltage $V_{max}$, voltage increment $V_{step}$, acquisition time $t_a$ during which the current is continuously measured and recorded. Scan direction can also be specified, i.e., from $V_{min}$ to $V_{max}$ (i.e., forward scan FW) or from $V_{max}$ to $V_{min}$ (i.e., reverse scan RS). Photocurrent density can be measured and converted to the current I. Parameters to control the light source are also entered, such as the illumination strength (e.g., 1 sun), light pre-soaking time and other light control parameters. The current and voltage values are recorded as a function of time for each of the FW and RS scans. The recorded data may be stored in a memory and later retrieved for analyses. An example set of the measured photocurrent values and the applied voltage values is shown in FIG. 9, for the case of $V_{min}$=−0.1 V, $V_{max}$=1.0 V, $V_{step}$=0.1 V, and $t_a$=10 sec.

The sub-program PART L includes a transient analysis program. In this program, a transient signal model is used to fit the photocurrent-versus-time data, taken during the acquisition time $t_a$ for each voltage value, to the following equations (1) and (2) for the FW and RS scans, respectively:

$$I(t) = I(0) - \sum_{i=0}^{n} [I(\infty) - I(0)] \cdot \left[1 - \exp\left(-\frac{t}{\tau_i}\right)\right] \quad \text{Eq. (1)}$$

$$I(t) = I(\infty) - \sum_{i=0}^{n} [I(0) - I(\infty)] \cdot \exp\left(-\frac{t}{\tau_i}\right) \quad \text{Eq. (2)}$$

Figure 10:
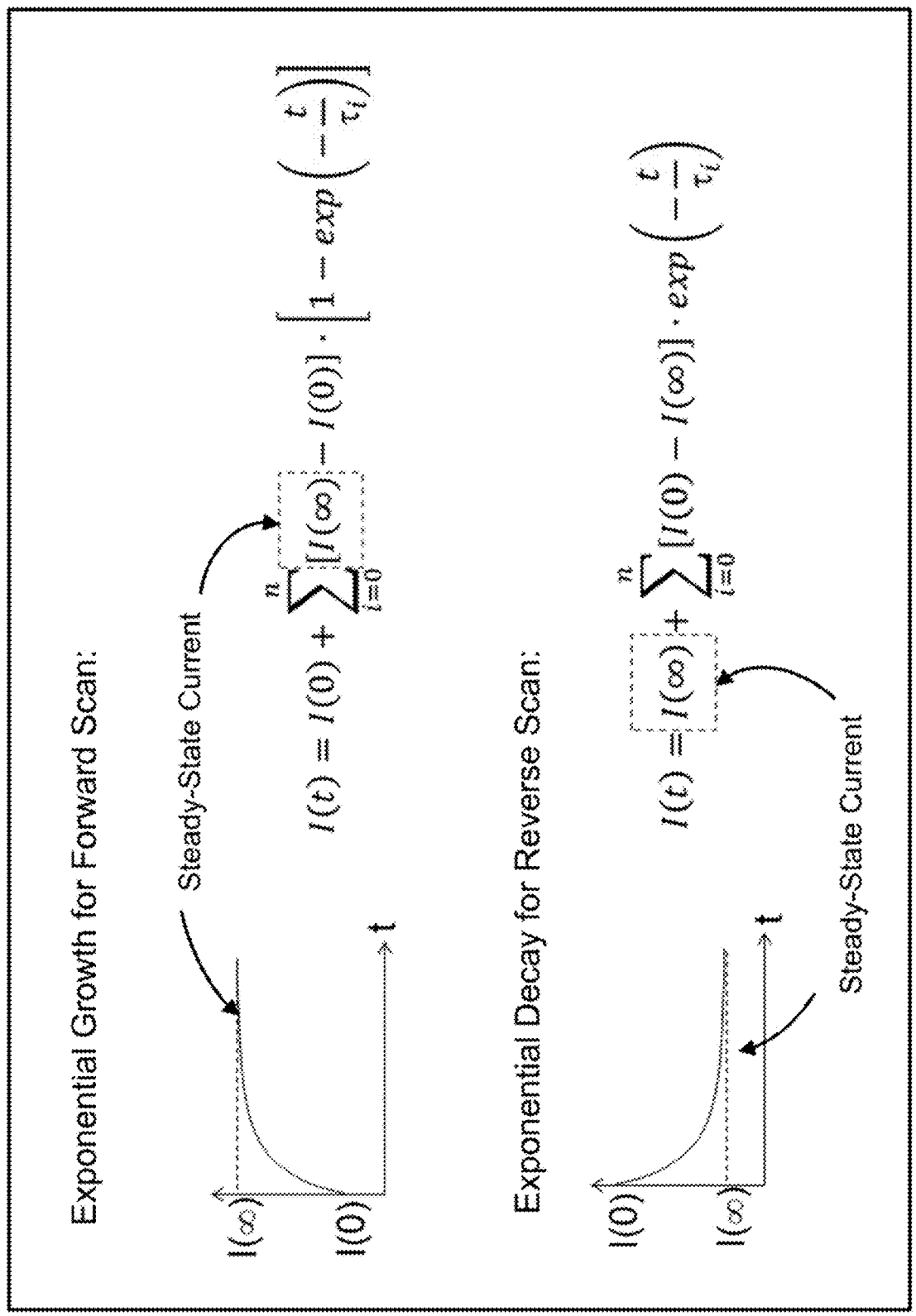
FIG. 10 shows schematic I-V curves along with the transient signal model equations (1) and (2), representing the exponential growth for the FW scan and the exponential decay for the RS scan, respectively.

FIG. 10 shows schematic I-V curves along with the transient-signal model equations (1) and (2), representing the exponential growth for the FW scan and the exponential decay for the RS scan, respectively. $I(\infty)$ is the steady-state current for each case, i.e., the current at t→∞. Multi-exponential functions, e.g., three terms i=0, 1, 2 in the above equations, may be needed to have a good fit between the raw data and the model equations. The time constant parameters $\tau_i$ generally characterize the speed (fast or slow) of the growth/decay.

Figure 11:
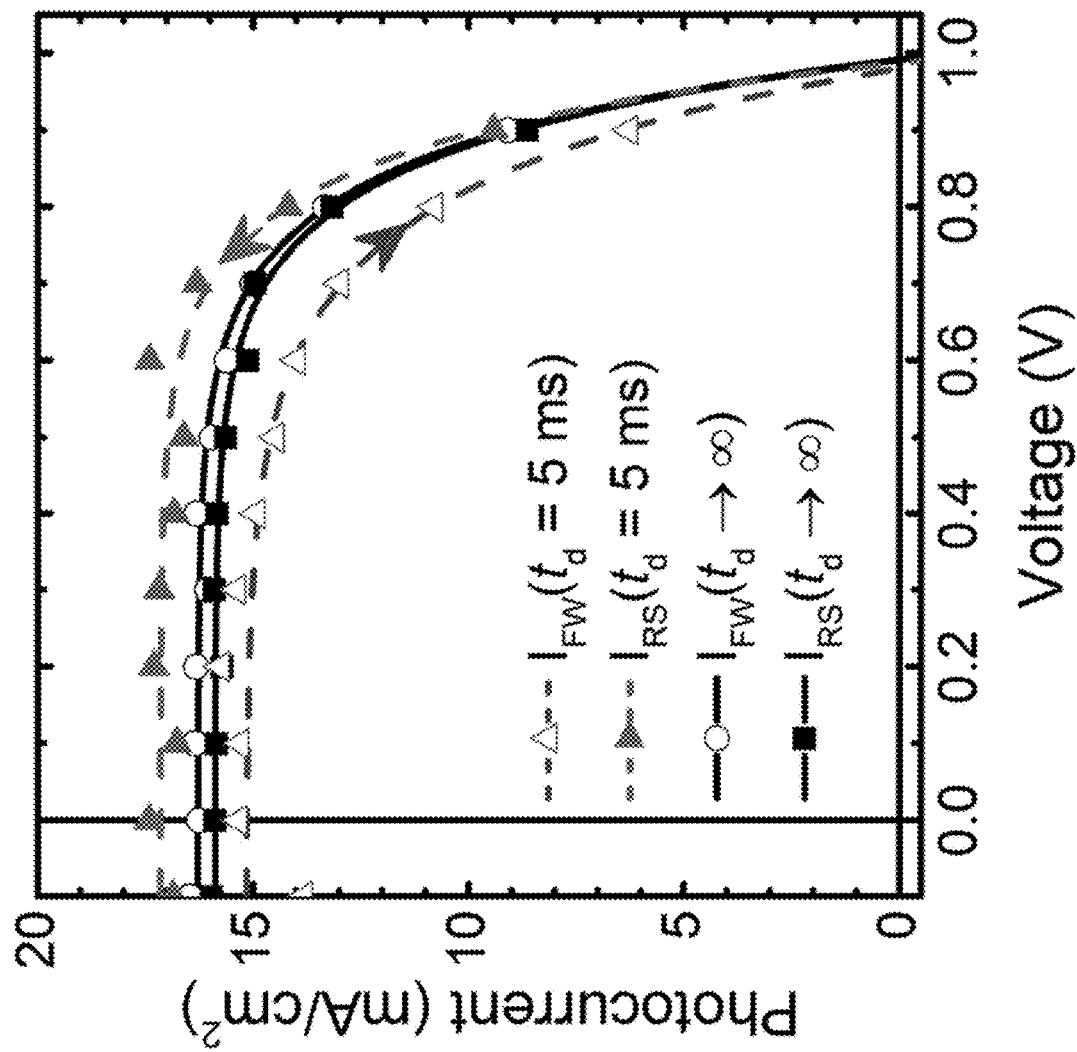
FIG. 11 shows plots of examples of the photocurrent versus the applied voltage to aid the illustration of the sub-program PART L to carry out the second measurement based on the second procedure.

FIG. 11 shows plots of examples of the photocurrent versus the applied voltage to aid the illustration of the sub-program PART L to carry out the second measurement based on the second procedure, which includes the above transient signal modelling. These example plots in FIG. 11 are obtained by using MAPbI$_3$-based solar cells. In FIG. 11, four plots of the photocurrent versus the applied voltage are shown, wherein the photocurrent is measured by applying the voltage in the form of a staircase function as illustrated in FIG. 9, and the transient behavior of the photocurrent is analysed based on the transient signal model for FW and RS according to Eqs. (1) and (2), respectively. The four plots correspond, respectively, to the four cases of: FW with t=t$_d$=5 ms, RS with t=t$_d$=5 ms, FW with t=t$_d$→∞, and RS with t=t$_d$→∞, where t$_d$ represents a delay time within the transient. Due to the hysteresis effects prominent in a perovskite solar cell, power conversion efficiency (PCE) is generally different between the FW scanned I-V and the RS scanned I-V. Ideally, a representative PCE value should be determined when the PCEs extracted from the FW scanned I-V and the RS scanned I-V substantially coincide. In the example shown in FIG. 11, the steady-state PCE values of 11.7% and 11.4% were extracted for the FW and RS scan directions, respectively, whereas with t$_d$=5 ms two substantially different PCE values of 10.6% and 12% were extracted for the FW and RS scan directions, respectively. That is, a better overlapping between the FW and RS scanned I-V curves is obtained under the steady-state conditions (t=t$_d$→∞). Therefore, it can be concluded that PCEs obtained by using the steady-state current values represent device performances that are more realistic than using the non-steady-state current values.

Figure 12:
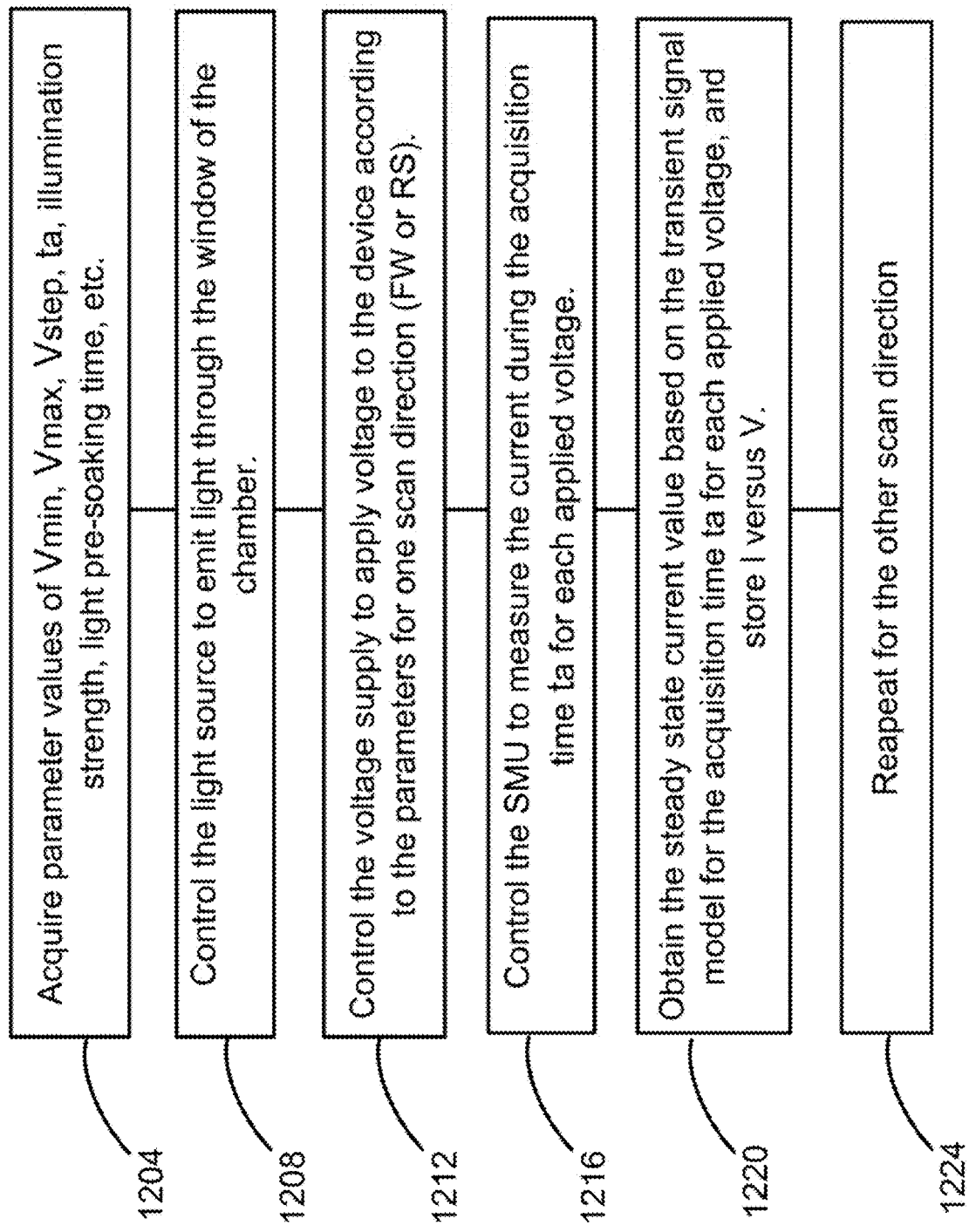
FIG. 12 shows an example process of the sub-programs PART L and PART J for carrying out the second I-V measurement based on the second procedure including the transient signal modelling.

FIG. 12 shows an example process of the sub-programs PART L and PART J for carrying out the second I-V measurement based on the second procedure including the transient signal modelling. Prior to starting the second I-V measurement according to the sub-programs PART L and PART J, the switch board is controlled by the sub-program PART I to select a device among the N devices in the device holder in the chamber, as per the user input using a user interface such as the control panel illustrated in FIG. 6, or to select devices in sequence automatically or as specified. In step 1204, parameter values necessary for the I-V measurements are acquired. These parameters include voltage control parameters such as $V_{min}$, $V_{max}$, $V_{step}$, and $t_a$, etc. and light control parameters such as illumination strength and pre-soaking time. These parameters may be inputted by the user using the control panel, or may be predetermined and pre-stored in a memory and retrieved in this step 1204. In step 1208, the light source is controlled to emit light through the window of the chamber to shine the device under measurement to provide energy, i.e., photons, according to the light control parameters. In step 1212, the voltage supply is controlled to apply voltage to the device according to the sub-program PART J with the voltage control parameters. That is, the voltage is varied with a stepwise increase/decrease $V_{step}$ after each $t_a$, giving the form of a staircase function of time. In step 1216, the SMU is controlled to measure the current during the acquisition time $t_a$ for each applied voltage, wherein the voltage value starts with $V_{min}$ and increases by $V_{step}$ until $V_{max}$ is reached for the FW scan; or the voltage value starts with $V_{max}$ and decreases by $V_{step}$ until $V_{min}$ is reached for the RS scan. In step 1220, the steady-state current value is obtained based on the transient signal model for the acquisition time $t_a$ for each applied voltage. The resultant I versus V data may be stored in a memory. The same measurement is repeated for the other scan direction as in step 1224. Examples of the resultant I-V curves are plotted in FIG. 11. It should be understood by one with ordinary skill in the art that, in an engineering flow chart for actual programming, the steps for the measurement and computation for each applied voltage should be expressed in a do-loop by varying the voltage incrementally, and that the process flow expressed in FIG. 12 is for the purpose of illustrating the second procedure according to the present embodiment.

In the sub-program PART L for carrying out the second I-V measurement, the transient signal model using Eqs. (1) and (2) above is utilized to obtain the steady-state current value $I(\infty)$ based on the measured current values during $t_a$ for each applied voltage. An actual steady-state current value can be obtained by waiting for a long time (i.e., a long acquisition time $t_a$) for the current to reach the steady state after each stepwise increase/decrease $V_{step}$. However, this procedure will add too much time to the measurement and evaluation process and will defeat the original purpose of achieving automated performance evaluations with a high throughput. It should be noted that, in FIG. 7, where the first I-V measurement is carried out according to the sub-program PARK K based on the first procedure in which the average of the measured current values over $t_a$ is obtained for each voltage value, the acquisition time $t_a$ can be relatively short, e.g., on the order of 1-10 ms. On the other hand, when the second I-V measurement is carried out according to the sub-program PART L based on the second procedure in which the transient signal model is used to obtain the steady-state current values, the data taking of measured current values should be continued for a sufficient length of time so that the data fitting to the model equations, Eqs. (1) and (2), can be done reasonably well. For example, the acquisition time $t_a=10$ s is used for this purpose in FIG. 9. Therefore, when the user needs to carry out the measurement fast to get quick evaluation results, only the sub-program PART K may be executed to carry out the first I-V measurement based on the first procedure including the averaging procedure, which is conventionally employed for typical solar cell evaluations. On the other hand, when the user needs to obtain evaluation results by taking into consideration the hysteresis behavior prominent in perovskite-based optoelectronic devices, the sub-program PART L (the second I-V measurement based on the second procedure including the transient signal modelling) should be executed. Alternatively, both can be carried out for detailed analyses and comparison.

Figure 13:
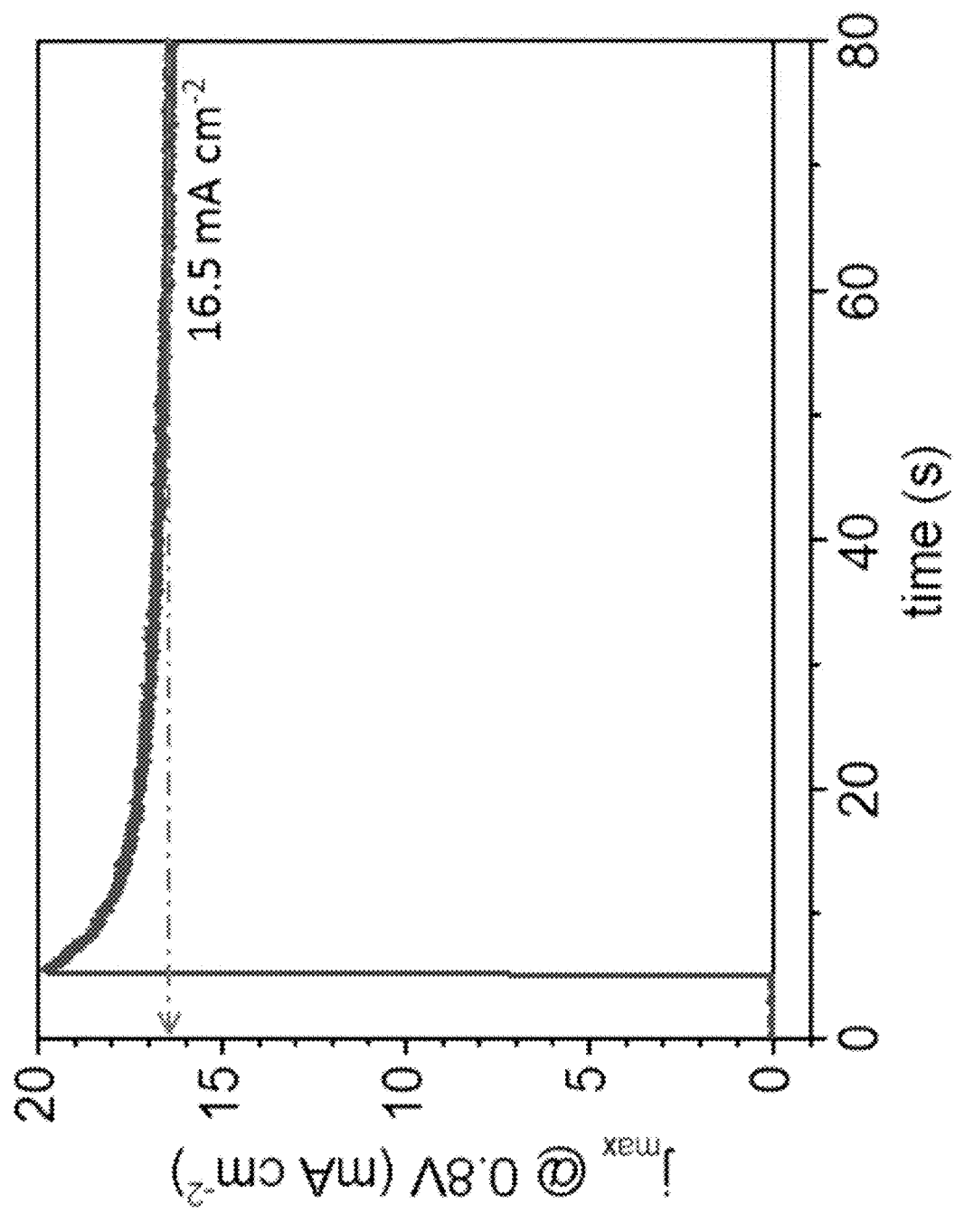
FIG. 13 shows an example plot of the measured photocurrent as a function of time.

To supplement the steady-state information, the sub-program PART M shown in FIG. 2 may be configured to control at least the SMU and the DC voltage supply for carrying out the steady-state photocurrent measurement. Parameters to be entered for this measurement include: illumination strength, light soaking time, bias voltage, and a length of time for the measurement to continue until the current reaches a steady-state. FIG. 13 shows an example plot of the measured photocurrent as a function of time. For this measurement, the perovskite solar cell is illuminated under 1 sun, and after a predetermined period of time (5 s in this case), the circuit is closed under the bias voltage of 0.8 V, which corresponds to the cell's maximum power point (MPP). The steady-state photocurrent density is measured to be approximately 16.5 mA/cm² after 50-80 s in this example.

Based on the obtained I-V data via the sub-program PART K (first I-V measurement) or PART L (second I-V measurement), various performance parameters can be extracted, including at least one of: power conversion efficiency (PCE), short circuit current (Jsc), open circuit voltage (Voc), maximum power point (MPP), current at MPP (I@MPP), voltage at MPP (V@MPP), and optimum external resistance. MPP is defined to be the point where I x V gives the maximum value in the I-V curve; and the optimum external resistance is defined to be V@MPP/I@MPP. These performance parameters can be obtained for the FW scan and the RV scan separately, and the average values for both scans can also be obtained.

Each of the first and second I-V measurements can be carried out repeatedly with a predetermined interval (e.g., 1 hour) to obtain a stability profile of each device. The sub-program PART N can be used to carry out the stability measurement, wherein the I-V measurement is repeated with the predetermined interval to obtain the time evolution of device performances. The sub-program PART N may be configured to control at least the SMU and the DC voltage supply according to the sub-program PART K and PART L for repeating the first I-V measurement and the second I-V measurement, respectively. One of the first and the second I-V measurements can be selected to repeat, or both can be selected to repeat. The sub-programs to extract the performance parameters based on the I-V data may be included in PART K (e.g., after each first I-V measurement), PART L (e.g., after each second I-V measurement), or in the main controlling program PART H or in the stability measurement sub-program PART N (e.g., after collecting a set of I-V data taken at different times with the predetermined interval).

Parameters to be entered for running the sub-program PART N for carrying out the stability measurement include: time interval for repeating the I-V measurement, e.g., once an hour, and bias voltage to simulate a continuous operation with a load. The bias voltage is applied to the device during the period when the current and voltage data are not taken within each interval to simulate the load with which the device will be operated at the MPP. The performance parameters are extracted and stored, and can be plotted as a function of time.

Figure 14:
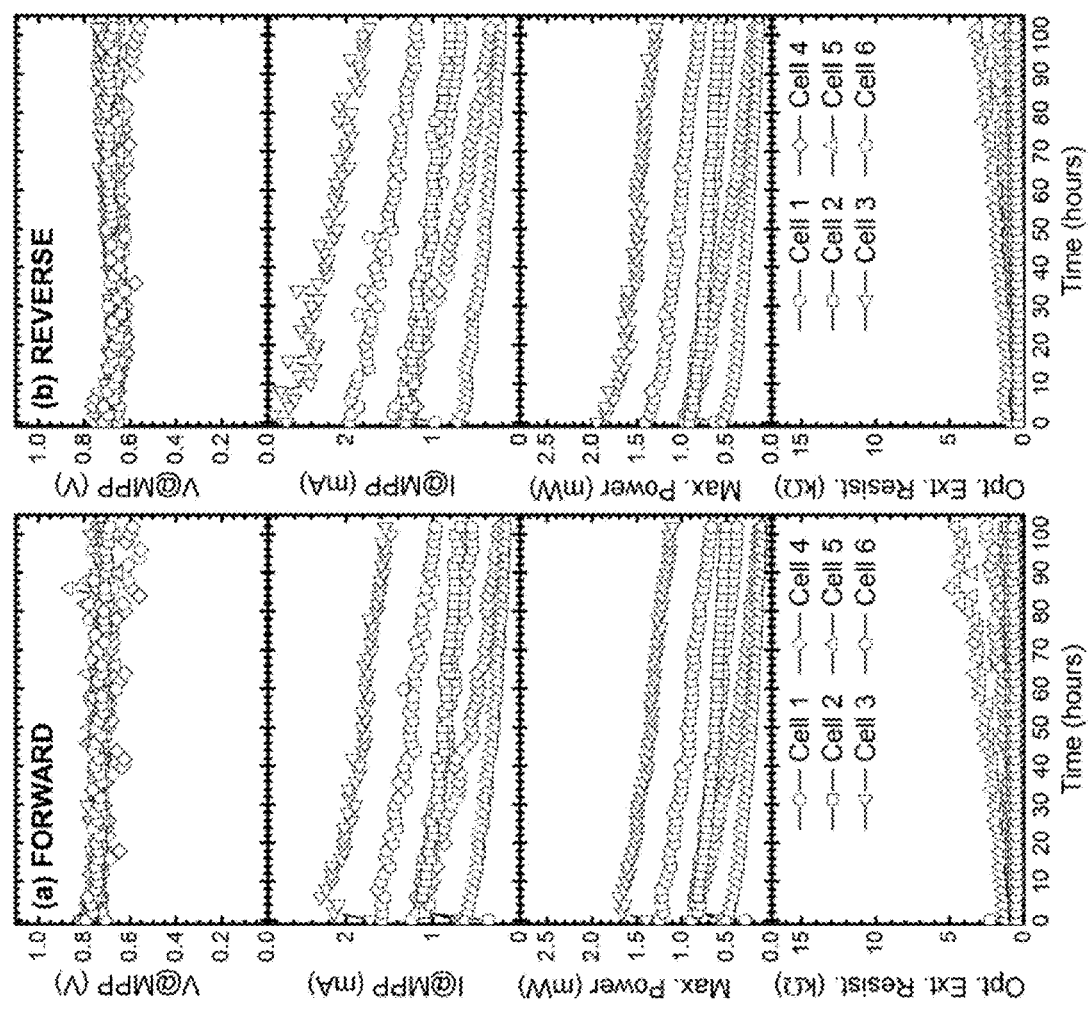
FIG. 14 shows plots of examples of the time evolutions of V@MPP, I@MPP, MPP, and optimum external resistance values, for the FW scan in (a) and the RS scan in (b).

FIG. 14 shows plots of examples of the time evolutions of V@MPP, I@MPP, MPP, and optimum external resistance values, for the FW scan in (a) and the RS scan in (b). Six MAPbI₃-based solar cells are used as the test devices and measured for 100 hours with one hour interval, wherein each measurement is based on the second procedure including the transient signal modelling.

Figure 15:
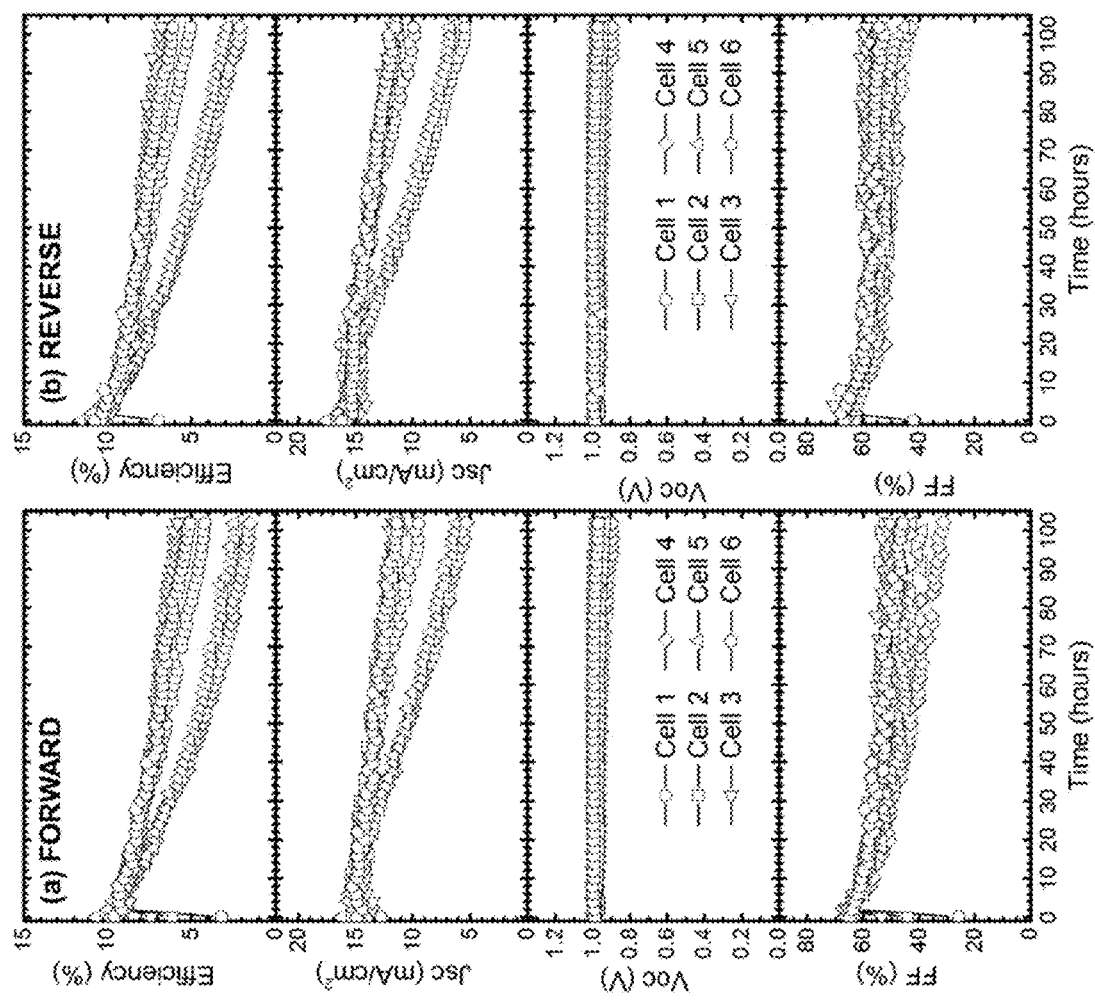
FIG. 15 shows plots of examples of the time evolutions of PCE, Jsc, Voc and FF for the FW scan in (a), the RS scan in (b) and the average in (c).

FIG. 15 shows plots of examples of the time evolutions of PCE, Jsc, Voc and FF for the FW scan in (a) and the RS scan in (b). Six MAPbI₃-based solar cells are used as the test devices and measured for 100 hours with one hour interval, wherein each measurement is based on the second procedure including the transient signal modelling.

Figure 16:
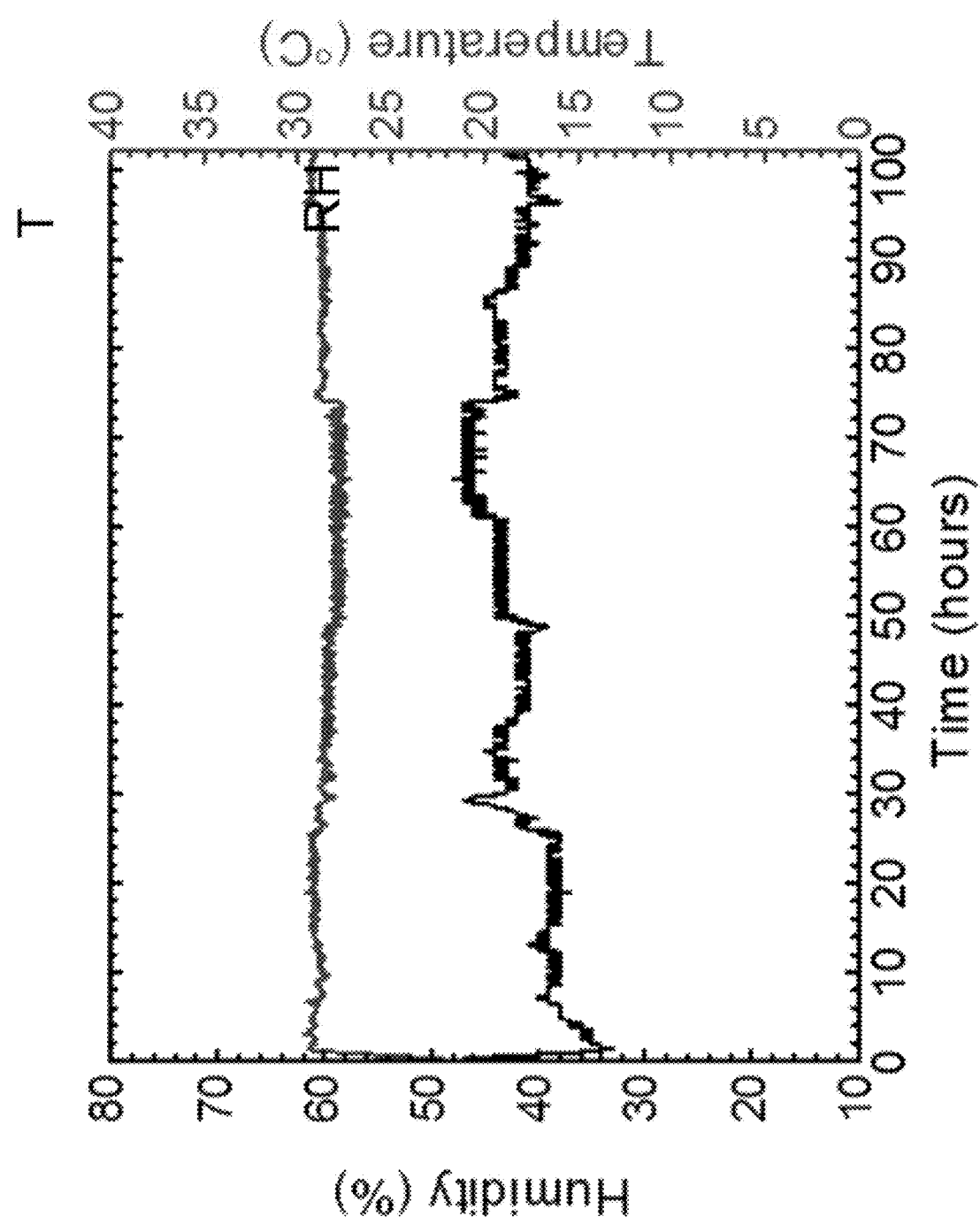
FIG. 16 shows plots of examples of the relative humidity and temperature values for 100 hours.

The sub-program PART P in FIG. 2 is used to monitor the environment including relative humidity and temperature in the chamber (PART A) for the analysis of the environmental effects to the device performance. One or more IC-based sensors may be mounted in the chamber to monitor environmental conditions during the stability measurement (PART N). Parameters to be entered for carrying out the monitoring include: monitoring interval and length of time. The relative humidity and temperature data are recorded. FIG. 16 shows plots of examples of the relative humidity (RH) and temperature (T) values for 100 hours.

When the system is used for performance evaluation of LEDs, lasers and other light-emitting devices, the sub-program PART O may be used to control acquisition of data from the photodetector (PART B). Similar to the case of having solar cells for the test devices, a device among the N devices in the device holder in the chamber is selected via the switch board according to the sub-program PART I; the voltage is applied to the device according to the sub-program PART J with the voltage control parameters. In the light-emitting device, the electron-hole charge carriers are combined to generate photons in the active layer, i.e., the perovskite layer in the present example, and the generated light is emitted through the window attached to the chamber to reach the photodetector. The data captured by the photodetector can be stored in a memory of the computer for analyses.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A system for assessing performance of a plurality of devices, the system comprising:
   a chamber housing a device holder configured to hold the plurality of devices, the chamber having a chamber wall defining an opening that is sealed with a window;
   a light source configured to emit light that enters the chamber through the window to shine the plurality of devices in the device holder, wherein the plurality of devices are a plurality of perovskite solar cells;
   a switch board coupled to the device holder for allowing selection of a device among the plurality of devices for measurement;
   a DC voltage supply coupled to the switch board to apply voltage to the device;
   a source/measure unit (SMU) coupled to the switch board for measuring current of the device;
   a computer implemented with a software program including computer executable instructions to control at least the SMU, the DC voltage supply, the switch board, and the light source, to obtain at least one of first current-versus-voltage (I-V) data based on a first procedure and second I-V data based on a second procedure for analyzing hysteresis behavior of the device, and
   wherein the first procedure includes averaging of current values measured from the SMU over an acquisition time for each voltage value to obtain the first I-V data, and the second procedure includes obtaining a steady-state current value measured from the SMU for each voltage to obtain the second I-V data.

2. The system of claim 1, wherein
   the DC voltage supply is controlled to apply the voltage in a form of a staircase function of time, wherein a stepwise increase in voltage is given for a forward scan and a stepwise decrease in voltage is given for a reverse scan; and
   the SMU is controlled to measure current values during an acquisition time after each stepwise increase in voltage for the forward scan and after each stepwise decrease in voltage for the reverse scan.

3. The system of claim 2, wherein
   the first procedure includes averaging of the current values over the acquisition time for each voltage value to obtain the first I-V data for the forward scan and the reverse scan.

4. The system of claim 2, wherein
   the second procedure includes obtaining a steady-state current value for each voltage value to obtain the second I-V data for the forward scan and the reverse scan.

5. The system of claim 4, wherein
   the steady-state current value is obtained based on a transient signal model, wherein the current values measured during the acquisition time for each voltage value for the forward scan are fitted to an exponential growth equation, and the current values measured during the acquisition time for each voltage for the reverse scan are fitted to an exponential decay equation, to obtain the steady-state current values for the forward scan and the reverse scan by taking time to infinite in the exponential growth equation and the exponential decay equation, respectively.

6. The system of claim 2, wherein
   voltage control parameters for determining the form of the staircase function are acquired via the computer, the voltage control parameters including the acquisition time that is shorter for the first procedure than for the second procedure.

7. The system of claim 1, wherein
   the switch board is controlled to sequentially select a device for the measurement through the plurality of devices.

8. The system of claim 1, wherein
   the DC voltage supply is controlled to apply bias voltage to the other devices to be under operating conditions.

9. The system of claim 2, wherein
   at least the SMU and the DC voltage supply are controlled to repeat, with a predetermined interval, measuring the current of the device; and
   the software program is configured to extract performance parameters as a function of time based on at least one of the first I-V data for the forward scan and the reverse scan that are repeatedly obtained and the second I-V data for the forward scan and the reverse scan that are repeatedly obtained, the performance parameters including at least one of: power conversion efficiency (PCE), short circuit current (Jsc), open circuit voltage (Voc), maximum power point (MPP), current at the MPP (I@MPP), voltage at the MPP (V@MPP), and optimum external resistance.

10. The system of claim 1, further comprising:
    a gas inlet coupled with the chamber wall for inletting one or more types of gas into the chamber; and
    a gas outlet coupled with the chamber wall for vacuuming and exhausting the chamber.

11. The system of claim 1, further comprising:
    one or more sensors housed in the chamber and configured to communicate with the computer, for monitoring an environment including relative humidity and temperature in the chamber.

12. A computer-implemented method for assessing performance of a plurality of devices, by using a system comprising a chamber housing a device holder configured to hold the plurality of devices, the chamber having a chamber wall defining an opening that is sealed with a window, a light source configured to emit light that enters the chamber through the window to shine the plurality of devices in the device holder, wherein the plurality of devices are a plurality of perovskite solar cells, a switch board coupled to the device holder, a DC voltage supply coupled to the switch board, a source/measure unit (SMU) coupled to the switch board, and the computer coupled at least to the SMU, the DC voltage supply, the switch board and the light source, the method comprising:
  selecting, by the switch board, a device among the plurality of devices for measurement;
  applying, by the DC voltage supply, voltage to the device, the voltage being in a form of a staircase function of time, wherein a stepwise increase in voltage is given for a forward scan and a stepwise decrease in voltage is given for a reverse scan;
  measuring, by the SMU, current of the device, wherein current values during an acquisition time are measured after each stepwise increase in voltage for the forward scan and after each stepwise decrease in voltage for the reverse scan; and
  obtaining, based on the measured current values, at least one of first current-versus-voltage (I-V) data according to a first procedure and second I-V data according to a second procedure for analyzing hysteresis behavior of the device,
  wherein the first procedure includes averaging of current values measured from the SMU over an acquisition time for each voltage value to obtain the first I-V data, and the second procedure includes obtaining a steady-state current value measured from the SMU for each voltage to obtain the second I-V data.

13. The method of claim 12, wherein
the first procedure includes averaging of the current values over the acquisition time for each voltage value to obtain the first I-V data for the forward scan and the reverse scan.

14. The method of claim 12, wherein
the second procedure includes obtaining a steady-state current value for each voltage value to obtain the second I-V data for the forward scan and the reverse scan.

15. The method of claim 14, wherein
the steady-state current value is obtained based on a transient signal model, wherein the current values measured during the acquisition time for each voltage value for the forward scan are fitted to an exponential growth equation, and the current values measured during the acquisition time for each voltage for the reverse scan are fitted to an exponential decay equation, to obtain the steady-state current values for the forward scan and the reverse scan by taking time to infinite in the exponential growth equation and the exponential decay equation, respectively.

16. The method of claim 12, further comprising:
acquiring voltage control parameters for determining the form of the staircase function including the acquisition time that is shorter for the first procedure than for the second procedure.

17. The method of claim 12, wherein
the selecting comprises sequentially selecting, by the switch board, a device through the plurality of devices for measurement; and
the applying further comprises applying, by the DC voltage supply, bias voltage to the other devices to be under operating conditions.

18. The method of claim 12, further comprising:
repeating, with a predetermined interval, the applying through the obtaining; and
extracting performance parameters as a function of time based on at least one of the first I-V data for the forward scan and the reverse scan that are repeatedly obtained and the second I-V data for the forward scan and the reverse scan that are repeatedly obtained, the performance parameters including at least one of: power conversion efficiency (PCE), short circuit current (Jsc), open circuit voltage (Voc), maximum power point (MPP), current at the MPP (I@MPP), voltage at the MPP (V@MPP), and optimum external resistance.

19. The method of claim 12, further comprising:
controlling at least the SMU and the DC voltage supply to measure a steady-state current value by applying bias voltage to the device and measuring the current until it reaches a steady state.

20. The method of claim 12, further comprising:
monitoring, by one or more sensors housed in the chamber, an environment including relative humidity and temperature in the chamber.

* * * * *